(12) United States Patent
Do et al.

(10) Patent No.: US 8,067,271 B2
(45) Date of Patent: Nov. 29, 2011

(54) INTEGRATED CIRCUIT PACKAGE SYSTEM WITH ENCAPSULATION LOCK

(75) Inventors: Byung Tai Do, Singapore (SG); Sung Uk Yang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 112 days.

(21) Appl. No.: 11/532,509

(22) Filed: Sep. 15, 2006

(65) Prior Publication Data
US 2008/0067640 A1    Mar. 20, 2008

(51) Int. Cl.
*H01L 23/495* (2006.01)
(52) U.S. Cl. . 438/123; 257/666; 257/670; 257/E23.039; 257/E23.043; 257/E23.046; 438/111
(58) Field of Classification Search ................ 257/666, 257/E23.039, E23.043, E23.046, 670; 438/111, 438/123
See application file for complete search history.

(56) References Cited

U.S. PATENT DOCUMENTS

| | | | |
|---|---|---|---|
| 4,862,246 A * | 8/1989 | Masuda et al. ............... | 257/666 |
| 5,623,163 A * | 4/1997 | Izumi ............................ | 257/667 |
| 5,753,969 A | 5/1998 | Suzuya et al. | |
| 5,898,216 A * | 4/1999 | Steffen ......................... | 257/679 |
| 5,973,388 A | 10/1999 | Chew et al. | |
| 6,127,206 A * | 10/2000 | Nakamichi ................... | 438/111 |
| 6,166,430 A | 12/2000 | Yamaguchi | |
| 6,197,615 B1 | 3/2001 | Song et al. | |
| 6,448,633 B1 * | 9/2002 | Yee et al. ...................... | 257/666 |
| 6,483,178 B1 * | 11/2002 | Chuang ......................... | 257/672 |
| 6,501,161 B1 | 12/2002 | Lee | |
| 6,639,306 B2 | 10/2003 | Huang | |
| 6,661,083 B2 | 12/2003 | Lee et al. | |
| 6,812,552 B2 * | 11/2004 | Islam et al. ................... | 257/666 |
| 6,815,833 B2 | 11/2004 | Lee et al. | |
| 7,042,071 B2 | 5/2006 | Minamio et al. | |
| 7,060,535 B1 | 6/2006 | Sirinorakul et al. | |
| 7,060,536 B2 | 6/2006 | Punzalan et al. | |
| 7,115,978 B2 * | 10/2006 | Sun et al. ...................... | 257/676 |
| 7,221,045 B2 * | 5/2007 | Park et al. ..................... | 257/676 |
| 7,361,531 B2 * | 4/2008 | Sharma et al. ................ | 438/111 |
| 2002/0079561 A1 * | 6/2002 | Yasunaga et al. ............ | 257/670 |
| 2003/0201520 A1 * | 10/2003 | Knapp et al. ................. | 257/666 |
| 2004/0046240 A1 | 3/2004 | Hasebe | |
| 2004/0084757 A1 * | 5/2004 | Seo ............................... | 257/672 |
| 2004/0175864 A1 * | 9/2004 | Mahle .......................... | 438/107 |
| 2004/0227217 A1 * | 11/2004 | Jang ............................. | 257/676 |
| 2004/0262781 A1 | 12/2004 | Germain et al. | |
| 2005/0051876 A1 * | 3/2005 | Manalac et al. .............. | 257/666 |
| 2005/0242417 A1 | 11/2005 | Youn et al. | |
| 2005/0258521 A1 | 11/2005 | Park et al. | |
| 2007/0170559 A1 * | 7/2007 | Camacho et al. ............. | 257/676 |
| 2008/0067639 A1 | 3/2008 | Do et al. | |
| 2008/0067698 A1 | 3/2008 | Do et al. | |

OTHER PUBLICATIONS

K. Gilleo, Area Array Processes, McGraw Hill, 2004, p. 99.*
K. Gilleo, Area Array Processes, McGraw Hill, 2004, p. 99.

* cited by examiner

*Primary Examiner* — Eugene Lee
*Assistant Examiner* — Peniel M Gumedzoe
(74) *Attorney, Agent, or Firm* — Mikio Ishimaru

(57) ABSTRACT

An integrated circuit package system is provided including forming an external interconnect and a tie bar, forming a lead tip and a lead body of the external interconnect, forming a hole in the external interconnect, forming a slot in the tie bar, connecting an integrated circuit die and the external interconnect, and molding the external interconnect and the tie bar with the slot and the hole filled.

20 Claims, 6 Drawing Sheets

INTEGRATED CIRCUIT PACKAGE SYSTEM WITH ENCAPSULATION LOCK

CROSS-REFERENCE TO RELATED APPLICATION

The present application contains subject matter related to concurrently filed U.S. patent application Ser. No. 11/532,510 by Byung Tai Do and Sung Uk Yang entitled "Integrated Circuit Package System with Encapsulation Lock". The related application is assigned to STATS ChipPAC Ltd.

The present application also contains subject matter related to a concurrently filed U.S. patent application Ser. No. 11/532,508 by Byung Tai Do and Sung Uk Yang entitled "Integrated Circuit Package System with Encapsulation Lock". The related application is assigned to STATS Chip-PAC Ltd.

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

One proven way to reduce cost is to use mature package technologies with existing manufacturing methods and equipments. Existing packaging technologies struggle to cost effectively meet the ever demanding thermal, reliability, and structural requirements of today's integrated circuits and packages.

Most integrated circuit devices use molded plastic epoxy as an epoxy mold compound (EMC) for protecting package. But the poor heat dissipation property of EMC sometimes leads to device malfunctions. Some integrated circuit devices are large and/or very thin such that they become susceptible to warpage. Both heat and warpage may lead to delamination of the molding compound. The encapsulation delamination may also pose other problems, such as poor performance in moisture level sensitivity (MSL) tests.

A variation of existing technologies uses mature package technologies with lead fingers made from lead frames. However, lead frame packages typically use bond wires electrically connecting the lead fingers to the integrated circuit. Another variation of existing technologies uses solder bumps on the integrated circuit with a flip chip mounting. Yet another variation combines flip chip style mounting with lead frame packages.

The lead design of integrated circuit packages, such as quad flat nonleaded (QFN) packages, generally has a lug feature to provide locking between lead and mold compound. But, it adversely reduces metal-to-metal space and disturbs mold compound flow. This impact is bigger than other types of lead frame packages due to its inherently small size of the package. As a result, it causes reliability problem such as delamination between lead, tie-bar or paddle and mold compound or internal void. When it comes to the Flip Chip packages, die area covers more space above the paddle and some portion of leads as well and the problem tends to be more serious or more frequent.

Thus, a need still remains for an integrated circuit package system providing low cost manufacturing and improved reliability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an external interconnect and a tie bar, forming a lead tip and a lead body of the external interconnect, forming a hole in the external interconnect, forming a slot in the tie bar, connecting an integrated circuit die and the external interconnect, and molding the external interconnect and the tie bar with the slot and the hole filled.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
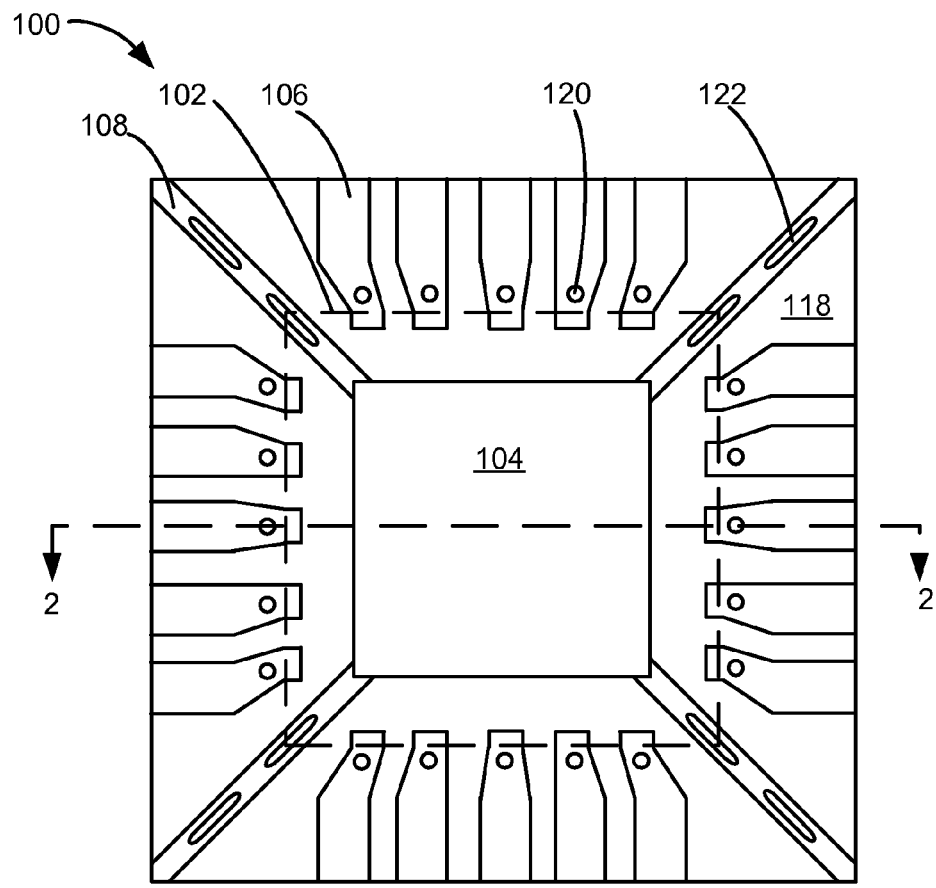
FIG. 1 is a plan view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a plan view of an integrated circuit package system 100 in an embodiment of the present invention. The integrated circuit package system 100 includes an integrated circuit die 102 over a paddle 104, such as die-attach paddle. The integrated circuit die 102 extends over a portion of external interconnects 106, such as leads, and tie bars 108. The tie bars 108 connect to the corners of the paddle 104.

The external interconnects 106 have holes 120, such as through holes. The holes 120 are located towards the interior portion, to the integrated circuit package system 100, of the external interconnects 106 relative. The tie bars 108 have longitudinal slots 122 along a length-wise dimension of each of the tie bars 108. A portion of the longitudinal slots 122 is under the integrated circuit die 102.

An encapsulation 118, such as an epoxy mold compound, covers the integrated circuit die 102, the paddle 104, the tie bars 108, and the external interconnects 106. The encapsulation 118 flows through and fills the holes 120 in the external interconnects 106 as well as the slots 122 of the tie bars 108 forming mold locks. The mold locks form structural reinforcement holding the encapsulation 118 in place. The mold locks help resist delamination of the encapsulation and improves performance in moisture sensitivity level (MSL) test.

For illustrative purpose, the tie bars 108 are shown having two instances of the slots 122, although it is understood that the number of the slots 122 may differ. Also for illustrative purposes, the slots 122 are shown as substantially the same, although it is understood that the slots 122 may differ from one another.

Figure 2:
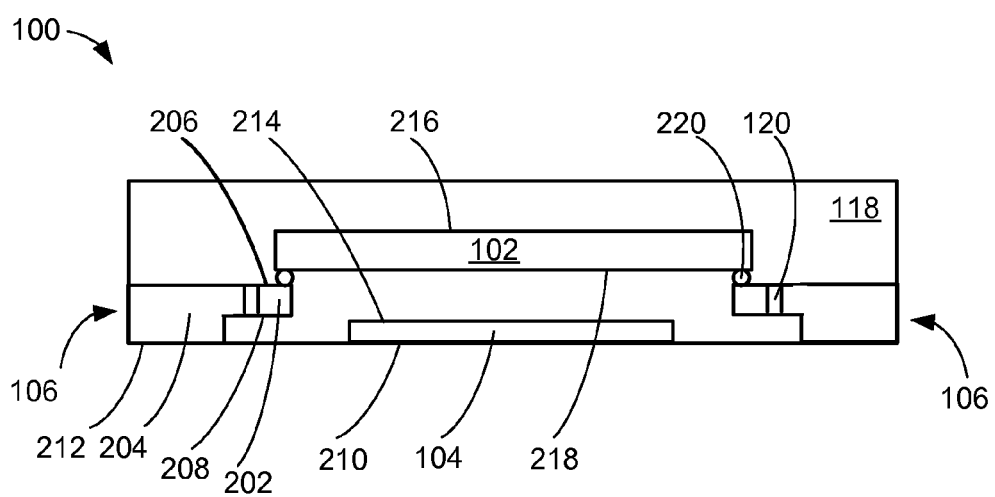
FIG. 2 is a cross-sectional view of the integrated circuit package system of FIG. 1.

Referring now to FIG. 2, therein is shown a cross-sectional view of the integrated circuit package system 100 of FIG. 1. The cross-sectional view is along segment 2-2 in FIG. 1. Each of the external interconnects 106 has a lead tip 202 and a lead body 204. The lead tip 202 may be formed by any number of processes, such as half etching the external interconnects 106.

The formation for the lead tip 202 also forms the lead body 204. The lead tip 202 has the holes 120 from a lead tip top surface 206 to a lead tip bottom surface 208. The encapsulation 118 fills the holes 120 as well as the slots 122 of FIG. 1 forming a mold locks. A layer of the encapsulation 118 is formed below and surrounding the holes 120. Similarly, a layer of the encapsulation 118 is formed above and surrounding the holes 120. Thus, the encapsulation 118 is molded through the holes 120 integral with a layer of the encapsulation 118 above the through hole and a layer of the encapsulation 118 below the through hole.

The paddle 104 is between the external interconnects 106. A paddle bottom surface 210 of the paddle 104 is in substantially the same horizontal plane as a lead body bottom surface 212 of the lead body 204. The paddle 104 may be formed by any number of processes, such as by half etching. A paddle top surface 214 of the paddle 104 is below the lead tip top surface 206. The lead tip top surface 206 is planar across extents of the lead tip 202. The paddle 104 may serve multiple functions, such as thermal dissipation or ground connection.

For illustrative purpose, the paddle top surface 214 is described as below the same horizontal plane as the lead tip top surface 206, although it is understood that the paddle top surface 214 may not be below the lead tip top surface 206. Also for illustrative purposes, the paddle bottom surface 210 is described as in substantially the same horizontal plane as the lead body bottom surface 212, although it is understood that the paddle bottom surface 210 and the lead body bottom surface 212 may not be in substantially the same horizontal plane.

The integrated circuit die 102 has a non-active side 216 and an active side 218. The integrated circuit die 102 is over the paddle 104 and connect to the lead tip 202 with an internal interconnect 220, such as a solder bump. The internal interconnect 220 is on the active side 218. The connection of the internal interconnect 220 do not fill the holes 120. The encapsulation 118 fills the holes 120 to provide mold locks for the integrated circuit package system 100.

Figure 3:
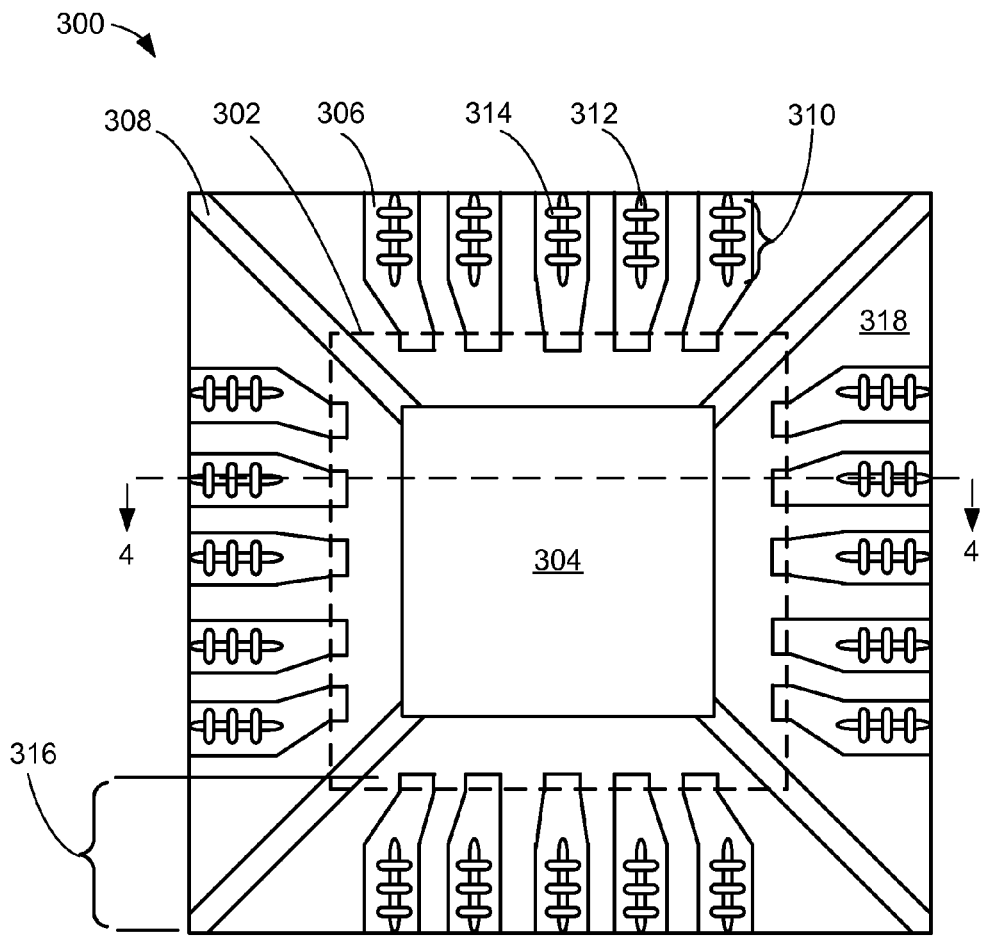
FIG. 3 is a plan view of an integrated circuit package system in an alternative embodiment of the present invention.

Referring now to FIG. 3, therein is shown a plan view of an integrated circuit package system 300 in an alternative embodiment of the present invention. The integrated circuit package system 300 includes an integrated circuit die 302 over a paddle 304, such as die-attach paddle. The integrated circuit die 302 extends over a portion of external interconnects 306, such as leads, and tie bars 308. The tie bars 308 connect to the corners of the paddle 304.

Each of the external interconnects 306 has a recess 310, such as an intersecting recess segments. The recess 310 is located towards an edge of the integrated circuit package system 300. The recess 310 has a first recess segment 312 and a second recess segment 314. The first recess segment 312 is along a length-wise dimension 316 of the external interconnects 306. The second recess segment 314 is perpendicular to the first recess segment 312. The recess 310 has the first recess segment 312 and three instances of the second recess segment 314.

For illustrative purposes, the recess 310 as shown has one instance of the first recess segment 312 and three instances of the second recess segment 314, although it is understood that the number of the first recess segment 312 and the second recess segment 314 may differ. Also for illustrative purposes, the configuration of the recess 310 has the first recess segment 312 orthogonal with the second recess segment 314, although it is understood that the first recess segment 312 and the second recess segment 314 may be in a different configuration. Further, for illustrative purposes, the recess 310 is shown having both the first recess segment 312 and the second recess segment 314, although it is understood that the recess 310 may not have both the first recess segment 312 and the second recess segment 314.

An encapsulation 318, such as an epoxy mold compound, covers the integrated circuit die 302, the paddle 304, the tie bars 308, and the external interconnects 306. The encapsulation 318 fills the recess 310 in the external interconnects 306 forming mold locks. The tie bars 308 and the paddle 304 also provide mold locks. The mold locks form structural reinforcement holding the encapsulation 318 in place. The mold locks help resist delamination of the encapsulation and improves performance in moisture sensitivity level (MSL) test.

Figure 4:
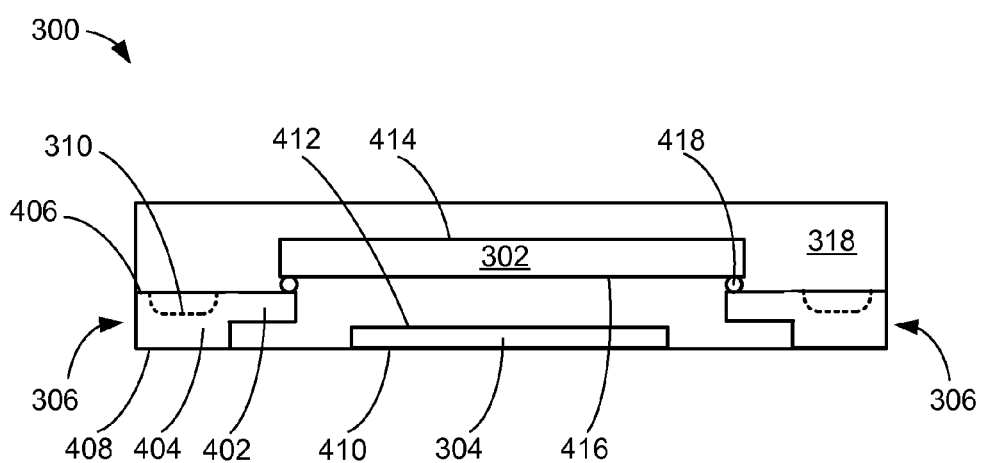
FIG. 4 is a cross-sectional view of the integrated circuit package system of FIG. 3.

Referring now to FIG. 4, therein is shown a cross-sectional view of the integrated circuit package system 300 of FIG. 3. The cross-sectional view is along segment 4-4 in FIG. 3. Each of the external interconnects 306 has a lead tip 402 and a lead body 404. The lead tip 402 may be formed by any number of processes, such as half etching the external interconnects 306.

The formation for the lead tip 402 also forms the lead body 404. The lead body 404 has the recess 310 from a lead body top surface 406 of the lead body 404. A lead body bottom surface 408 of the lead body 404 is used for connections to the next system level (not shown), such as a printed circuit board or another integrated circuit package system.

The paddle 304 is between the external interconnects 306. A paddle bottom surface 410 of the paddle 304 is in substantially the same horizontal plane as the lead body bottom surface 408. The paddle 304 may be formed by any number of processes, such as by half etching. A paddle top surface 412 of the paddle 304 is below the lead body top surface 406. The paddle 304 may serve multiple functions, such as thermal dissipation or ground connection.

For illustrative purpose, the paddle top surface 412 is described as not in substantially the same horizontal plane as the lead body top surface 406, although it is understood that the paddle top surface 412 and the lead body top surface 406 may be in substantially the same horizontal plane. Also for illustrative purposes, the paddle bottom surface 410 is described as in substantially the same horizontal plane as the lead body bottom surface 408, although it is understood that the paddle bottom surface 410 and the lead body bottom surface 408 may not be in substantially the same horizontal plane.

The integrated circuit die 302 has a non-active side 414 and an active side 416. The integrated circuit die 302 is over the paddle 304 and connect to the lead tip 402 with an internal interconnect 418, such as a solder bump. The internal interconnect 418 is on the active side 416. The connection of the internal interconnect 418 do not fill the recess 310. The encapsulation 318 fills the recess 310 to provide mold locks for the integrated circuit package system 300.

Figure 5:
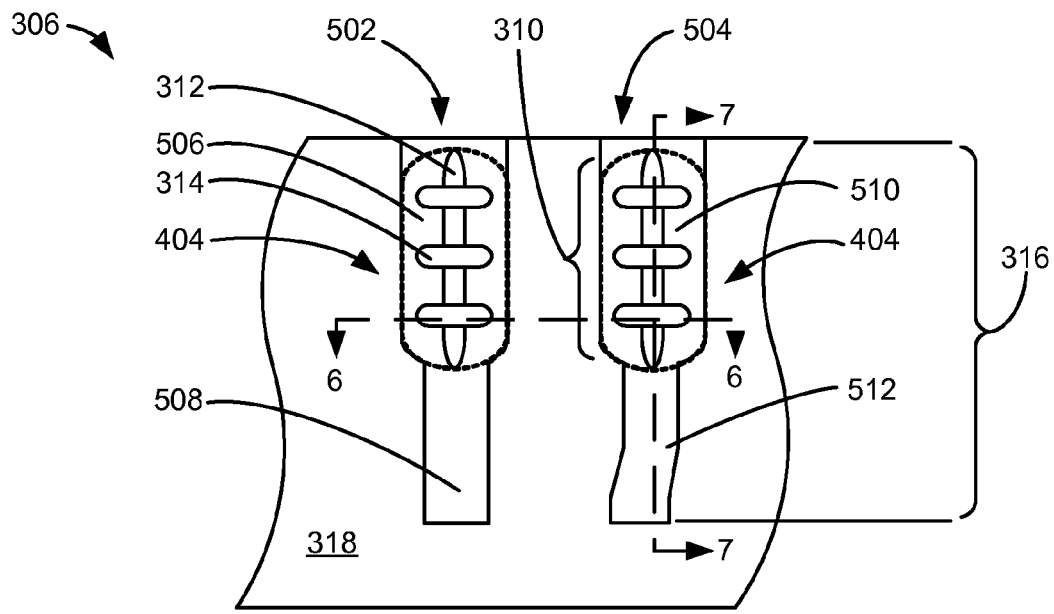
FIG. 5 is a more detailed plan view of a portion of the external interconnects of FIG. 3.

Referring now to FIG. 5, therein is shown a more detailed plan view of a portion of the external interconnects 306 of FIG. 3. This view depicts the portion of the external interconnects 306, such as a first external interconnect 502 and a second external interconnect 504.

The first external interconnect 502 has a first lead body 506 and a first lead tip 508. The first lead tip 508 is shown as a substantially straight segment extending from the first lead body 506. One instance of the recess 310 is in the first lead body 506. The second external interconnect 504 has a second lead body 510 and a second lead tip 512 The second lead tip 512 extends from the second lead body 510 with a displacement portion such that a tip end of the second lead tip 512 does not extend substantially straight from a body end of the second lead tip 512 next to the second lead body 510.

The first recess segment 312 has an orientation substantially parallel to the length-wise dimension 316 of the first lead body 506. The second recess segment 314 is perpendicular to and intersects the first recess segment 312 in the first lead body 506. Similarly, one instance of the recess 310 is also part of the second lead body 510. The first recess segment 312 and the second recess segment 314 are in a similar configuration in the second external interconnect 504 as in the first external interconnect 502.

The encapsulation 318 of FIG. 3 fills in the recess 310, such as the first recess segment 312 and the second recess segment 314, to form a mold lock from the top of the lead body 404, such as the first lead body 506 and the second lead body 510. The recess 310, with the intersecting pattern, is part of the mold lock in the horizontal dimensions of the integrated circuit package system 300 of FIG. 3.

Figure 6:
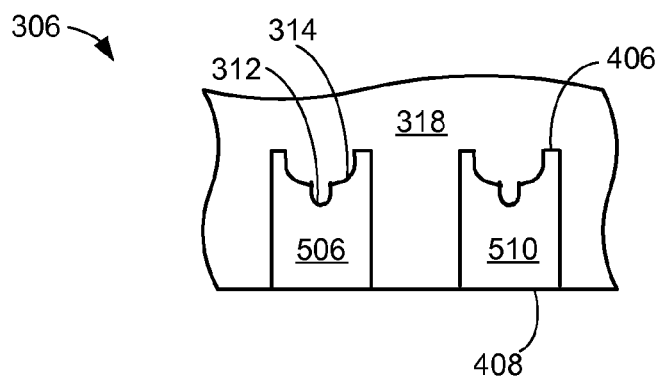
FIG. 6 is a cross-sectional view of the portion of the external interconnects of FIG. 5.

Referring now to FIG. 6, therein is shown a cross-sectional view of the portion of the external interconnects 306 of FIG. 5. The cross-sectional view is along the segment 6-6 in FIG. 5 showing the cross sections of the first lead body 506 and the second lead body 510.

The first lead body 506 has the second recess segment 314 in a curve shape from the lead body top surface 406. The first recess segment 312 is shown as another recess to the second intersecting recess segment and at a bottom portion of the second recess segment 314. The first recess segment 312 and the second recess segment 314 do not extend through the lead body bottom surface 408 of both the first lead body 506 and the second lead body 510. The encapsulation 318 fills the first recess segment 312 and the second recess segment 314.

Figure 7:
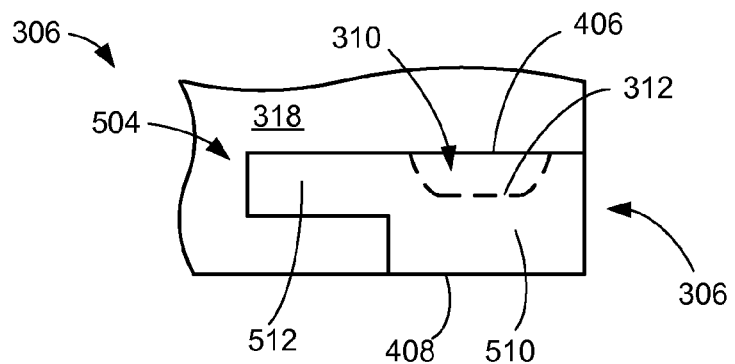
FIG. 7 is a different cross-sectional view of the portion of the external interconnects of FIG. 5.

Referring now to FIG. 7, therein is shown a different cross-sectional view of the portion of the external interconnects 306 of FIG. 5. The cross-sectional view is along the segment 7-7 in FIG. 5 showing the cross section of the second external interconnect 504 and may represent a similar cross section of any of the external interconnects 306 of FIG. 3.

This cross section shows the second lead tip 512 and the second lead body 510. An outline of the first recess segment 312 is shown as having a curve shape at the ends and flat in the middle. The first recess segment 312 is shown from the lead body top surface 406 and within the second lead body 510 while not part of the second lead tip 512. As mentioned earlier, the first recess segment 312 does not extend to the lead body bottom surface 408.

As mentioned earlier, the encapsulation 318 fills in the recess 310. The recess 310, with the paddle 304 of FIG. 3 and the lead tip 402 of FIG. 4, are also part of the mold lock in the vertical dimensions of the integrated circuit package system 300 of FIG. 3.

Figure 8:
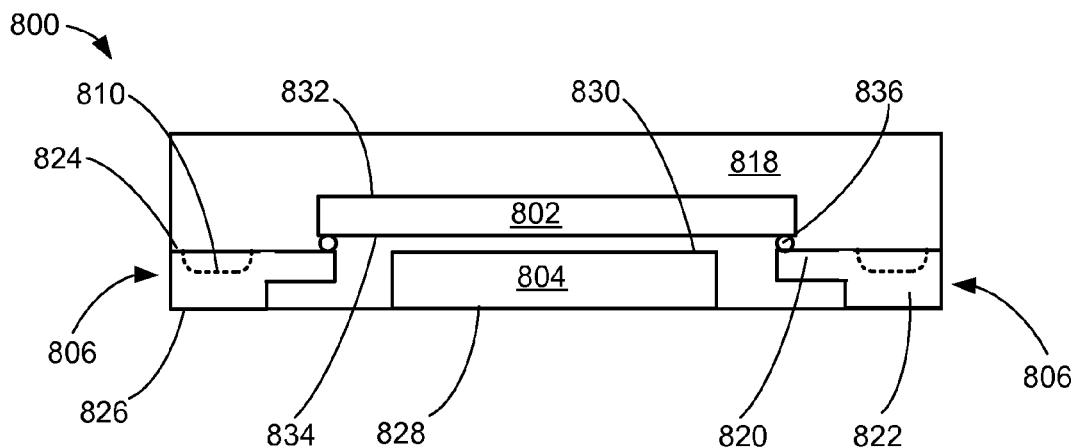
FIG. 8 is a cross-sectional view of an integrated circuit package system in another alternative embodiment of the present invention.

Referring now to FIG. 8, therein is shown a cross-sectional view of an integrated circuit package system 800 in another alternative embodiment of the present invention. This cross-sectional view may represent the cross section of the integrated circuit package system 300 along segment 4-4 in FIG. 3. Each of external interconnects 806 has a lead tip 820 and a lead body 822. The lead tip 820 may be formed by any number of processes, such as half etching the external interconnects 806.

The formation for the lead tip 820 also forms the lead body 822. The lead body 822 has a recess 810 from a lead body top surface 824 of the lead body 822. A lead body bottom surface 826 of the lead body 822 is used for connections to the next system level (not shown), such as a printed circuit board or another integrated circuit package system.

A paddle 804 is between the external interconnects 806. A paddle bottom surface 828 of the paddle 804 is in substantially the same horizontal plane as the lead body bottom surface 826. The paddle 804 may be formed by any number of processes, such as by punch or stamp of a lead frame (not shown). A paddle top surface 830 of the paddle 804 is in substantially the same horizontal plane as the lead body top surface 824. The paddle 804 may serve multiple functions, such as thermal dissipation or ground connection.

For illustrative purpose, the paddle top surface 830 is described as in substantially the same horizontal plane as the lead body top surface 824, although it is understood that the paddle top surface 830 and the lead body top surface 824 may not be in substantially the same horizontal plane. Also for illustrative purposes, the paddle bottom surface 828 is described as in substantially the same horizontal plane as the lead body bottom surface 826, although it is understood that the paddle bottom surface 828 and the lead body bottom surface 826 may not be in substantially the same horizontal plane.

An integrated circuit die 802 has a non-active side 832 and an active side 834. The integrated circuit die 802 is over the paddle 804 and connect to the lead tip 820 with an internal interconnect 836, such as a solder bump. The internal interconnect 836 is on the active side 834. The connection of the internal interconnect 836 do not fill the recess 810. An encapsulation 818 fills the recess 810 to provide mold locks for the integrated circuit package system 800.

Figure 9:
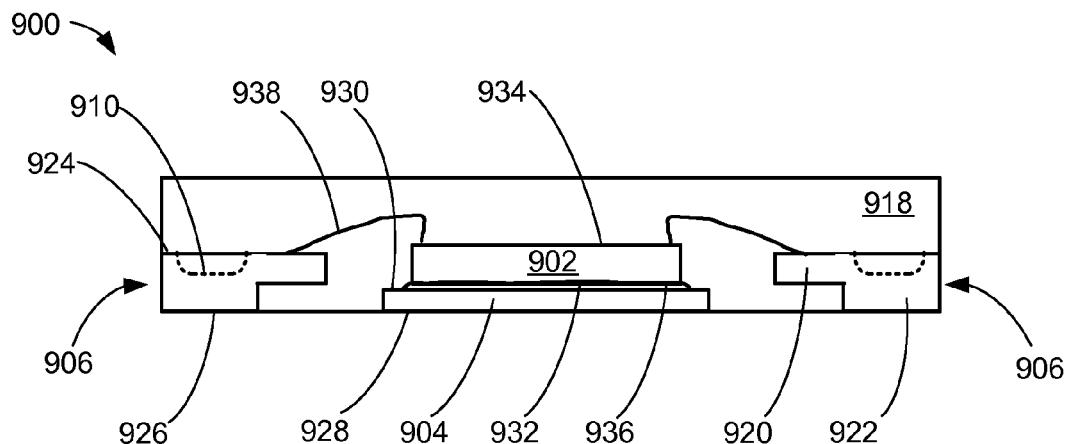
FIG. 9 is a cross-sectional view of an integrated circuit package system in yet another alternative embodiment of the present invention.

Referring now to FIG. 9, therein is shown a cross-sectional view of an integrated circuit package system 900 in yet another alternative embodiment of the present invention. Each of external interconnects 906 has a lead tip 920 and a lead body 922. The lead tip 920 may be formed by any number of processes, such as half etching the external interconnects 906.

The formation for the lead tip 920 also forms the lead body 922. The lead body 922 has a recess 910 from a lead body top surface 924 of the lead body 922. A lead body bottom surface 926 of the lead body 922 is used for connections to the next system level (not shown), such as a printed circuit board or another integrated circuit package system.

A paddle 904 is between the external interconnects 906. A paddle bottom surface 928 of the paddle 904 is in substantially the same horizontal plane as the lead body bottom surface 926. The paddle 904 may be formed by any number of processes, such as by half etching. A paddle top surface 930 of the paddle 904 is below the lead body top surface 924. The paddle 904 may serve multiple functions, such as thermal dissipation or ground connection.

For illustrative purpose, the paddle top surface 930 is described as not in substantially the same horizontal plane as the lead body top surface 924, although it is understood that the paddle top surface 930 and the lead body top surface 924 may be in substantially the same horizontal plane. Also for illustrative purposes, the paddle bottom surface 928 is described as in substantially the same horizontal plane as the lead body bottom surface 926, although it is understood that the paddle bottom surface 928 and the lead body bottom surface 926 may not be in substantially the same horizontal plane.

An integrated circuit die 902 has a non-active side 932 and an active side 934. The integrated circuit die 902 is attached on the paddle 904 with an adhesive 936 such as a die attach adhesive. The active side 934 connect to the lead tip 920 with an internal interconnect 938, such as bond wires. An encapsulation 918 fills the recess 910 to provide mold locks for the integrated circuit package system 900.

Figure 10:
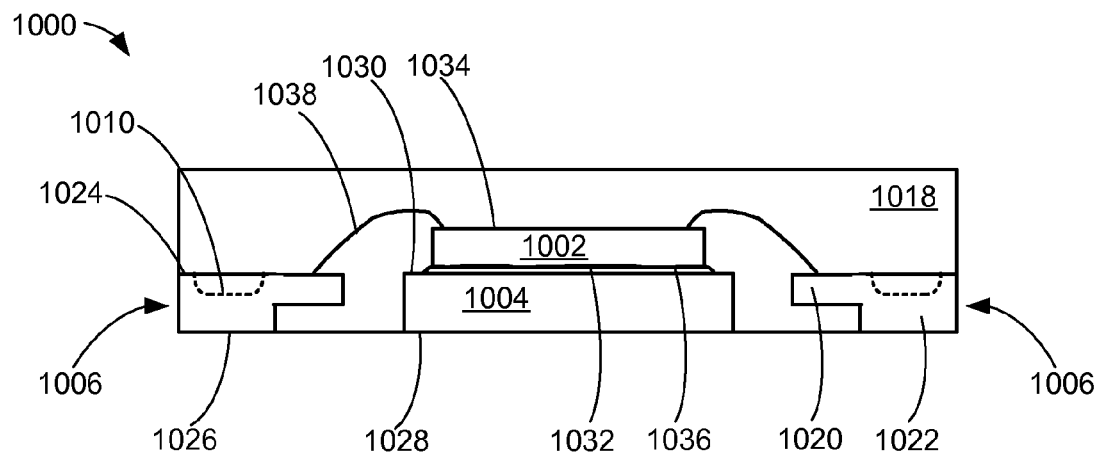
FIG. 10 is a cross-sectional view of an integrated circuit package system in yet another alternative embodiment of the present invention.

Referring now to FIG. 10, therein is shown a cross-sectional view of an integrated circuit package system 1000 in yet another alternative embodiment of the present invention. Each of external interconnects 1006 has a lead tip 1020 and a lead body 1022. The lead tip 1020 may be formed by any number of processes, such as half etching the external interconnects 1006.

The formation for the lead tip 1020 also forms the lead body 1022. The lead body 1022 has a recess 1010 from a lead body top surface 1024 of the lead body 1022. A lead body bottom surface 1026 of the lead body 1022 is used for connections to the next system level (not shown), such as a printed circuit board or another integrated circuit package system.

A paddle 1004 is between the external interconnects 1006. A paddle bottom surface 1028 of the paddle 1004 is in substantially the same horizontal plane as the lead body bottom surface 1026. The paddle 1004 may be formed by any number of processes, such as by punch or stamp of a lead frame (not shown). A paddle top surface 1030 of the paddle 1004 is in substantially the same horizontal plane as the lead body top surface 1024. The paddle 1004 may serve multiple functions, such as thermal dissipation or ground connection.

For illustrative purpose, the paddle top surface 1030 is described as in substantially the same horizontal plane as the lead body top surface 1024, although it is understood that the paddle top surface 1030 and the lead body top surface 1024 may not be in substantially the same horizontal plane. Also for illustrative purposes, the paddle bottom surface 1028 is described as in substantially the same horizontal plane as the lead body bottom surface 1026, although it is understood that the paddle bottom surface 1028 and the lead body bottom surface 1026 may not be in substantially the same horizontal plane.

An integrated circuit die 1002 has a non-active side 1032 and an active side 1034. The integrated circuit die 1002 is attached on the paddle 1004 with an adhesive 1036, such as a die attach adhesive. The active side 1034 connect to the lead tip 1020 with an internal interconnect 1038, such as bond wires. An encapsulation 1018 fills the recess 1010 to provide mold locks for the integrated circuit package system 1000.

Figure 11:
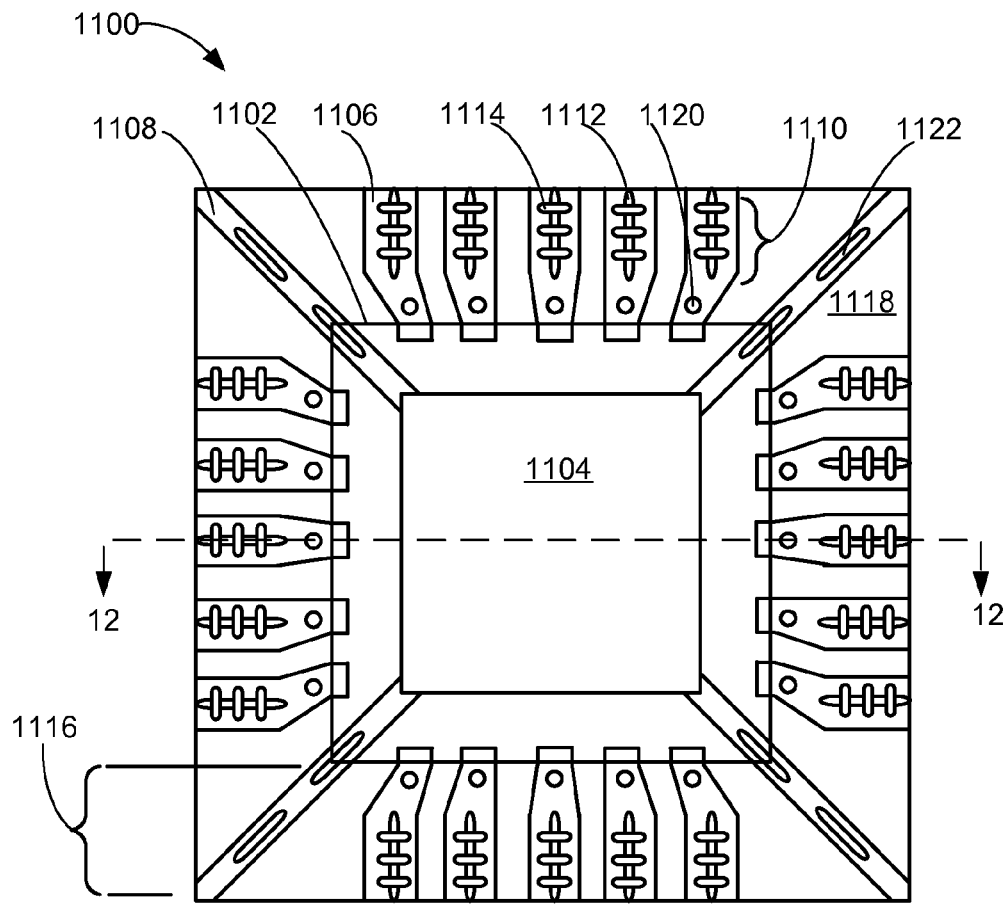
FIG. 11 is a plan view of an integrated circuit package system in yet another embodiment of the present invention.

Referring now to FIG. 11, therein is shown a plan view of an integrated circuit package system 1100 in yet another embodiment of the present invention. The integrated circuit package system 1100 includes an integrated circuit die 1102 over a paddle 1104, such as die-attach paddle. The integrated circuit die 1102 extends over a portion of external interconnects 1106, such as leads, and tie bars 1108. The tie bars 1108 connect to the corners of the paddle 1104.

Each of the external interconnects 1106 has a recess 1110, such as an intersecting recess segments. The recess 1110 is located towards an edge of the integrated circuit package system 1100. The recess 1110 has a first recess segment 1112 and a second recess segment 1114. The first recess segment 1112 is along a length-wise dimension 1116 of the external interconnects 1106. The second recess segment 1114 is perpendicular to the first recess segment 1112. The recess 1110 has the first recess segment 1112 and three instances of the second recess segment 1114.

For illustrative purposes, the recess 1110 as shown has one instance of the first recess segment 1112 and three instances of the second recess segment 1114, although it is understood that the number of the first recess segment 1112 and the second recess segment 1114 may differ. Also for illustrative purposes, the configuration of the recess 1110 has the first recess segment 1112 orthogonal with the second recess segment 1114, although it is understood that the first recess segment 1112 and the second recess segment 1114 may be in a different configuration.

The external interconnects 1106 also have holes 1120, such as through holes. The holes 1120 are located towards the interior portion, to the integrated circuit package system 11100, of the external interconnects 1106 relative. The tie bars 1108 have slots 1122.

An encapsulation 1118, such as an epoxy mold compound, covers the integrated circuit die 1102, the paddle 1104, the tie bars 1108, and the external interconnects 1106. The encapsulation 1118 fills the recess 1110 in the external interconnects 1106 forming mold locks. The encapsulation 1118 also flows through and fills the holes 1120 in the external interconnects 1106 as well as the slots 1122 of the tie bars 1108 forming additional mold locks. The mold locks form structural reinforcement holding the encapsulation 1118 in place. The mold locks help resist delamination of the encapsulation and improves performance in moisture sensitivity level (MSL) test.

Figure 12:
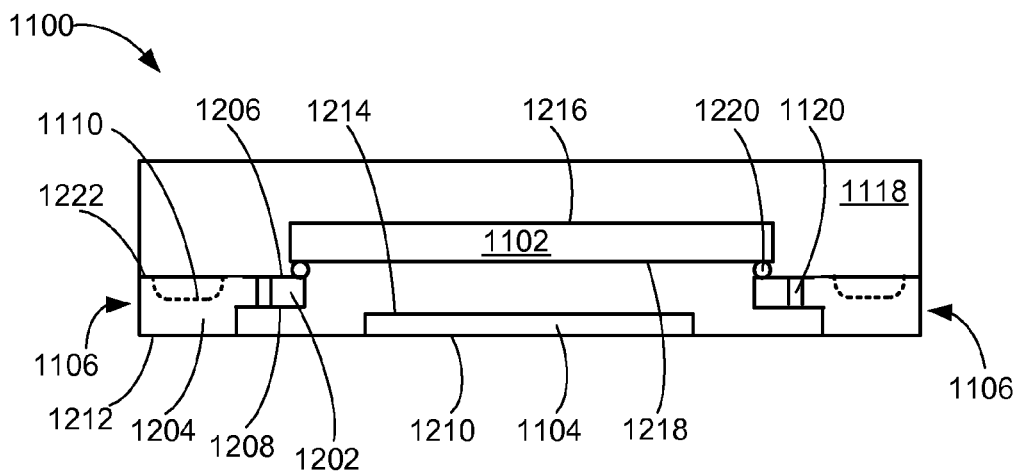
FIG. 12 is a cross-sectional view of the integrated circuit package system of FIG. 11.

Referring now to FIG. 12, therein is shown a cross-sectional view of the integrated circuit package system 1100 of FIG. 11. The cross-sectional view is along segment 12-12 in FIG. 11. Each of the external interconnects 1106 has a lead tip 1202 and a lead body 1204. The lead tip 1202 may be formed by any number of processes, such as half etching the external interconnects 1106. The lead tip 1202 has the holes 1120 from a lead tip top surface 1206 to a lead tip bottom surface 1208. The encapsulation 1118 fills the holes 1120 as well as the slots 1122 of FIG. 11 forming mold locks for the integrated circuit package system 1100.

The formation for the lead tip 1202 also forms the lead body 1204. The lead body 1204 has the recess 1110 from a lead body top surface 1222 of the lead body 1204. A lead body bottom surface 1212 of the lead body 1204 is used for connections to the next system level (not shown), such as a printed circuit board or another integrated circuit package system. The encapsulation 1118 also fills the recess 1110 to provide additional mold locks for the integrated circuit package system 1100.

The paddle 1104 is between the external interconnects 1106. A paddle bottom surface 1210 of the paddle 1104 is in substantially the same horizontal plane as the lead body bottom surface 1212. The paddle 1104 may be formed by any number of processes, such as by half etching. A paddle top surface 1214 of the paddle 1104 is below the lead body top surface 1222. The paddle 1104 may serve multiple functions, such as thermal dissipation or ground connection.

For illustrative purpose, the paddle top surface 1214 is described as not in substantially the same horizontal plane as the lead body top surface 1222, although it is understood that the paddle top surface 1214 and the lead body top surface 1222 may be in substantially the same horizontal plane. Also for illustrative purposes, the paddle bottom surface 1210 is described as in substantially the same horizontal plane as the lead body bottom surface 1212, although it is understood that the paddle bottom surface 1210 and the lead body bottom surface 1212 may not be in substantially the same horizontal plane.

The integrated circuit die 1102 has a non-active side 1216 and an active side 1218. The integrated circuit die 1102 is over the paddle 1104 and connect to the lead tip 1202 with an internal interconnect 1220, such as a solder bump. The internal interconnect 1220 is on the active side 1218. The connection of the internal interconnect 1220 do not fill the recess 1110.

Figure 13:
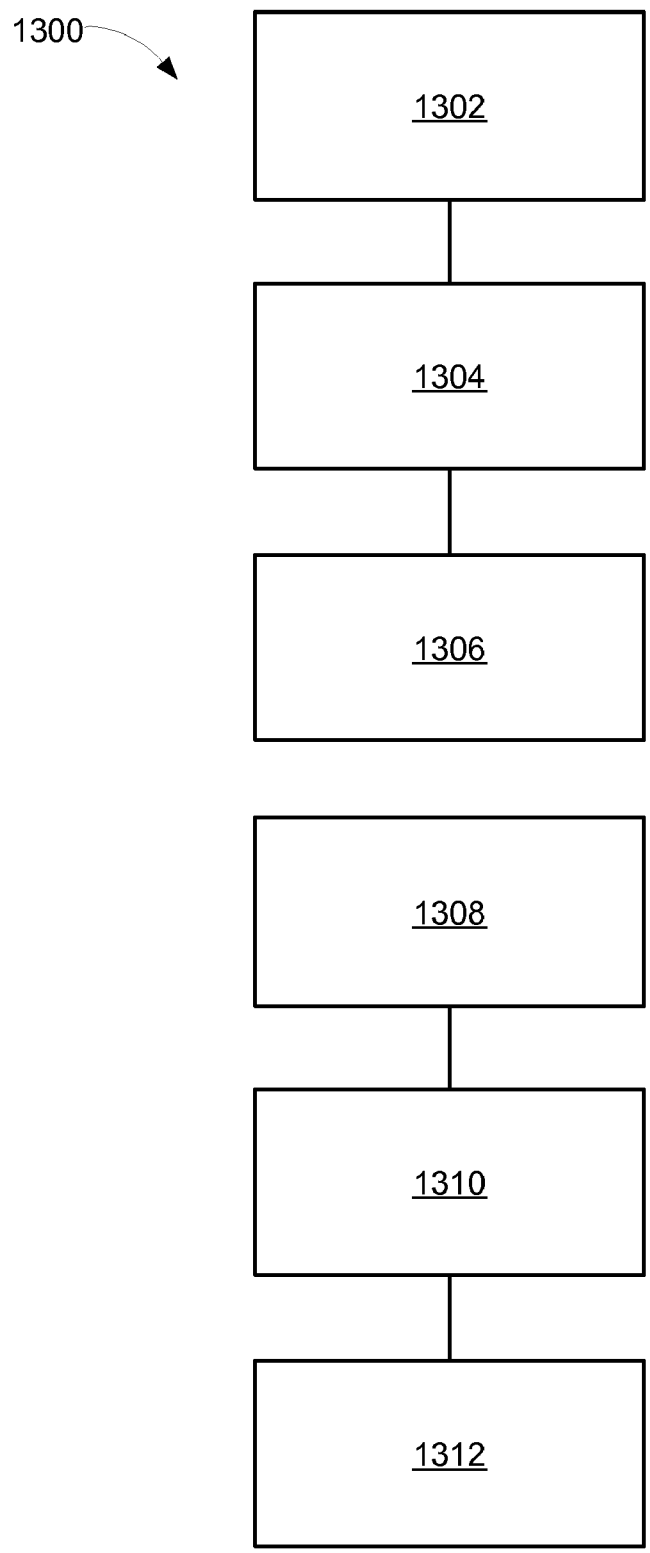
FIG. 13 is a flow chart of an integrated circuit package system for manufacture of the integrated circuit package system in an embodiment of the present invention.

Referring now to FIG. 13, therein is shown a flow chart of an integrated circuit package system 1300 for manufacture of the integrated circuit package system 100 in an embodiment of the present invention. The system 1300 includes forming an external interconnect and a tie bar in a block 1302; forming a lead tip and a lead body of the external interconnect in a block 1304; forming a hole in the external interconnect in a block 1306; forming a slot in the tie bar in a block 1308; connecting an integrated circuit die and the external interconnect in a block 1310; and molding the external interconnect and the tie bar with the slot and the hole filled in a block 1312.

It has been discovered that the present invention thus has numerous aspects.

It has been discovered that the present invention provides an integrated circuit package system with improved yield and reliability. The various mold lock features require less space, improves moldability, reduces delamination, and improves performance on reliability tests, such as moisture level sensitivity (MSL) test.

An aspect is that the present invention provides increased metal to metal spacing for improved molding compound flow to form the encapsulation. The intersecting recess segments, the holes in the lead tips, or the slots in the tie bars do not require additional structure, such as a lug between the external leads, to form mold locks.

Another aspect of the present invention provides multiple mold lock features for a distributed and multi-dimensional locking structure support. The intersecting recess segments, the holes in the lead tips, and the slots in the tie bars as well as the paddle forms mold locks distributed throughout the integrated circuit package system. The distribution of mold locks provides support in all three dimensions of the integrated circuit package system package.

Yet another aspect of the present invention provides structures for the mold lock features with improved adhesion between the leads as well as the tie bars and the encapsulation.

Yet another aspect of the present invention provides mold lock features improves reliability performance. The distributed, multi-dimensional mold locks reduces delamination of the encapsulation and improves performance in moisture sensitivity level (MSL) tests.

Yet another aspect of the present invention provides flexibility to select various mold locks locations in the possible locations provided by the distributed, multi-dimensional mold locks. The intersecting recess segments in the external interconnects, the slots in the tie bars, the holes in the external interconnects may be used individually or any combination thereof.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or

What is claimed is:

1. A method of making an integrated circuit package system comprising:
    forming an external interconnect, a paddle, and a tie bar, the external interconnect having a lead tip and a lead-body with a paddle top surface of the paddle below a lead top surface planar across extents of the lead tip, and a paddle bottom surface in a same horizontal plane as a lead bottom surface of the lead body;
    forming a through hole in the lead tip of the external interconnect;
    forming a longitudinal slot along a length-wise dimension of the tie bar;
    connecting an integrated circuit die and the external interconnect with a portion of the longitudinal slot under the integrated circuit die; and
    molding the external interconnect and the tie bar with an encapsulation through the through hole integral with a layer of the encapsulation above the through hole and a layer of the encapsulation below the through hole, the encapsulation filling the slot.

2. The method as claimed in claim 1 wherein the connecting includes attaching a solder bump between the integrated circuit die and the lead tip.

3. The method as claimed in claim 1 wherein the connecting includes attaching a bond wire between the integrated circuit die and the lead tip.

4. The method as claimed in claim 1 further comprising:
    forming a recess in the lead body from a lead body top surface; and
    wherein the molding fills the recess.

5. The method as claimed in claim 1 wherein the molding includes covering the integrated circuit die.

6. A method of making an integrated circuit package system comprising:
    forming an external interconnect, a paddle, and a tie bar, the external interconnect having a lead tip and a lead-body with a paddle top surface of the paddle below a lead top surface planar across extents of the lead tip, and a paddle bottom surface in a same horizontal plane as a lead bottom surface of the lead body;
    forming a through hole in the lead tip;
    forming a longitudinal slot along a length-wise dimension of the tie bar;
    connecting an integrated circuit die, over the paddle, and the external interconnect with a portion of the longitudinal slot under the integrated circuit die; and
    molding the external interconnect and the tie bar with an encapsulation through the through hole integral with a layer of the encapsulation above the through hole and a layer of the encapsulation below the through hole, the encapsulation filling the slot.

7. The method as claimed in claim 6 wherein forming the tie bar and the paddle includes connecting the tie bar and the paddle.

8. The method as claimed in claim 6 wherein forming the lead tip and the lead body of the external interconnect includes half etching the external interconnect to form the lead tip and the lead body.

9. The method as claimed in claim 6 wherein molding the external interconnect includes exposing the lead body at a lead body bottom surface.

10. The method as claimed in claim 6 wherein the molding includes covering the paddle.

11. An integrated circuit package system comprising:
    a paddle having a paddle top surface and a paddle bottom surface;
    an external interconnect having a lead tip with a through hole and a lead body with the paddle top surface below a lead top surface planar across extents of the lead tip, and the paddle bottom surface in a same horizontal plane as a lead bottom surface of the lead body;
    a tie bar having a longitudinal slot along a length wise dimension of the tie bar;
    an internal interconnect between an integrated circuit die and the external interconnect with a portion of the longitudinal slot under the integrated circuit die; and
    an encapsulation to cover the external interconnect and the tie bar with the encapsulation through the through hole integral with a layer of the encapsulation above the through hole and a layer of the encapsulation below the through hole, the encapsulation filling the slot.

12. The system as claimed in claim 11 wherein the internal interconnect is a solder bump between the integrated circuit die and the lead tip.

13. The system as claimed in claim 11 wherein the internal interconnect is a bond wire between the integrated circuit die and the lead tip.

14. The system as claimed in claim 11 further comprising:
    a recess in the lead body from a lead body top surface; and
    wherein the encapsulation is a filler in the recess.

15. The system as claimed in claim 11 wherein the encapsulation is a cover for the integrated circuit die.

16. The system as claimed in claim 11 wherein:
    the external interconnect is a lead having the lead tip and the lead body;
    the tie bar is next to the external interconnect;
    the slot is another through hole in the tie bar;
    the internal interconnect is on an active side of the integrated circuit die and connected to the external interconnect; and
    the encapsulation is cover for the external interconnect and the tie bar and a filler in the slot and the hole filled.

17. The system as claimed in claim 16 wherein the tie bar is connected to the paddle.

18. The system as claimed in claim 16 wherein the external interconnect having the lead tip and the lead body has a lead tip bottom surface above a lead body bottom surface.

19. The system as claimed in claim 16 wherein the encapsulation has the lead body at a lead body bottom surface exposed.

20. The system as claimed in claim 16 wherein the encapsulation is a cover for the paddle.

* * * * *